United States Patent
Ogawa

(10) Patent No.: US 11,508,901 B2
(45) Date of Patent: Nov. 22, 2022

(54) PIEZOELECTRIC COMPONENT, SENSOR, AND ACTUATOR

(71) Applicant: Murata Manufacturing Co., Ltd., Nagaokakyo (JP)

(72) Inventor: Hirozumi Ogawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 437 days.

(21) Appl. No.: 16/785,902

(22) Filed: Feb. 10, 2020

(65) Prior Publication Data
US 2020/0176668 A1  Jun. 4, 2020

Related U.S. Application Data

(63) Continuation of application No. PCT/JP2018/038809, filed on Oct. 18, 2018.

(51) Int. Cl.
| | | |
|---|---|---|
| *G01P 15/08* | (2006.01) | |
| *H01L 21/00* | (2006.01) | |
| *H01L 41/187* | (2006.01) | |
| *H01L 41/047* | (2006.01) | |
| *H01L 41/083* | (2006.01) | |
| *H01L 41/09* | (2006.01) | |
| *H01L 41/113* | (2006.01) | |
| *H01L 41/273* | (2013.01) | |

(52) U.S. Cl.
CPC ...... *H01L 41/1873* (2013.01); *H01L 41/0477* (2013.01); *H01L 41/083* (2013.01); *H01L 41/09* (2013.01); *H01L 41/113* (2013.01); *H01L 41/273* (2013.01)

(58) Field of Classification Search
CPC ............. H01L 41/1132; H01L 41/1138; H01L 41/047–0477; H01L 41/29–297
USPC ...................... 438/50–53; 257/254, 417–419
See application file for complete search history.

(56) References Cited

U.S. PATENT DOCUMENTS

| | | | |
|---|---|---|---|
| 4,939,405 A | 7/1990 | Okuyama et al. | |
| 7,431,785 B2 * | 10/2008 | Horikawa | H01L 41/273 |
| | | | 156/89.17 |

(Continued)

FOREIGN PATENT DOCUMENTS

| | | |
|---|---|---|
| DE | 3881668 T2 | 9/1993 |
| DE | 102007035623 A1 | 2/2009 |

(Continued)

OTHER PUBLICATIONS

German Office Action issued for DE 11 2018 003 429.1, date of Office Action Sep. 13, 2021.

(Continued)

*Primary Examiner* — Calvin Lee
(74) *Attorney, Agent, or Firm* — ArentFox Schiff LLP

(57) ABSTRACT

A piezoelectric component that has a piezoelectric element including a piezoelectric ceramic layer and a sintered metal layer on at least a first main surface of the piezoelectric ceramic layer and containing a non-precious metal, and a protective layer containing an elastic body covering first and second opposed main surfaces of the piezoelectric element. The piezoelectric ceramic layer contains 90 mol % or more of a perovskite compound that contains niobium, an alkali metal, and oxygen. A thickness of the piezoelectric element is 100 μm or less.

20 Claims, 3 Drawing Sheets

(56) References Cited

U.S. PATENT DOCUMENTS

| | | | |
|---|---|---|---|
| 7,504,042 B2* | 3/2009 | Kawada | H01L 41/083 |
| | | | 252/62.9 PZ |
| 8,567,695 B2* | 10/2013 | Lee | B41J 2/1646 |
| | | | 239/102.2 |
| 8,674,589 B2* | 3/2014 | Hatano | H01L 41/1873 |
| | | | 310/358 |
| 9,281,465 B2* | 3/2016 | Shimizu | H01L 41/187 |
| 9,660,175 B2* | 5/2017 | Saito | G02B 27/0006 |
| 10,199,559 B2* | 2/2019 | Kitada | H01L 41/1873 |
| 2014/0202629 A1 | 7/2014 | Uetani et al. | |
| 2016/0202113 A1 | 7/2016 | Petricevic | |
| 2016/0008852 A1 | 12/2016 | Miyoshi | |
| 2018/0226562 A1 | 8/2018 | Tani | |

FOREIGN PATENT DOCUMENTS

| | | |
|---|---|---|
| DE | 102011081276 A1 | 2/2013 |
| DE | 102012222239 A1 | 6/2014 |
| JP | 2000337971 A | 12/2000 |
| JP | 2014138144 A | 7/2014 |
| JP | 2015057838 A | 3/2015 |
| JP | 2015109627 A | 6/2015 |
| JP | 2016042559 A | 3/2016 |
| JP | 6132070 B2 | 5/2017 |
| WO | 2015064217 A1 | 5/2015 |
| WO | 2015166914 A1 | 11/2015 |
| WO | 2016157855 A1 | 10/2016 |
| WO | 2017073317 A1 | 5/2017 |

OTHER PUBLICATIONS

Written Opinion of the International Searching Authority issued for PCT/JP2018/041805, dated Dec. 18, 2018.
Japanese Office Action for Japanese Application No. 2019-552684, dated Aug. 17, 2021.
International Search Report Issued for PCT/JP2018/038809, dated Dec. 18, 2018.
Written Opinion of the International Searching Authority issued for PCT/JP2018/038809, dated Dec. 18, 2018.

* cited by examiner

PIEZOELECTRIC COMPONENT, SENSOR, AND ACTUATOR

CROSS REFERENCE TO RELATED APPLICATIONS

The present application is a continuation of International application No. PCT/JP2018/038809, filed Oct. 18, 2018, which claims priority to Japanese Patent Application No. 2017-216623, filed Nov. 9, 2017, the entire contents of each of which are incorporated herein by reference.

FIELD OF THE INVENTION

The present invention relates to a piezoelectric component, a sensor, and an actuator.

BACKGROUND OF THE INVENTION

A piezoelectric device mainly including a piezoelectric ceramic is widely used as an actuator and each of various sensors. For example, in a piezoelectric actuator, input electric energy is converted into mechanical energy by an inverse piezoelectric effect, and the piezoelectric actuator controls driving of various electronic devices. Also, in a piezoelectric sensor, input mechanical energy is converted into electric energy by a piezoelectric effect, and the piezoelectric sensor can measure a pressure value, acceleration, and the like with use of the electric energy as an electric signal.

Conventionally, the piezoelectric device has been formed by a method of bonding a piezoelectric ceramic to a substrate, a method of applying piezoelectric body paste to the substrate, or the like. However, since these methods require the substrate, thinning of the piezoelectric device has a limitation. In addition, since the substrate cannot significantly deflect, there is a problem in which the piezoelectric device does not sufficiently function as a deflection sensor or the like.

For this reason, a method for manufacturing a piezoelectric device without using a substrate has been proposed. For example, International Publication No. 2015/166914 (Patent Document 1) discloses a method for manufacturing a piezoelectric element in which, by co-sintering an alkali niobate piezoelectric ceramic and a sintered metal containing a non-precious metal, no substrate is used, and generation of cracks and the like is suppressed.

To prevent breakage of a piezoelectric element, disclosed are a piezoelectric device in which an insulating film is applied to a conductive film (Patent Document 2: International Publication No. 2017/073317), a piezoelectric device in which a piezoelectric element produced by providing a piezoelectric body layer on a resin film substrate is protected by a protective film (Patent Document 3: Japanese Patent Application Laid-Open No. 2000-337971), and the like.

Patent Document 1: International Publication No. 2015/166914
Patent Document 2: International Publication No. 2017/073317
Patent Document 3: Japanese Patent Laid-Open No. 2000-337971

SUMMARY OF THE INVENTION

However, even the piezoelectric element described in Patent Document 1 may crack when the piezoelectric element significantly deflects in a case in which the piezoelectric element is thin (100 µm or less). Also, in Patent Document 2, since the insulating film has a partially opened part for electrode extension, cracks may easily be generated at the part when the piezoelectric element deflects. Further, in Patent Document 3, since a lead-based piezoelectric ceramic material (mainly containing PZT: lead zirconate titanate) or the like is used as a material for the piezoelectric body, a substrate is required. Patent Document 3 also has a problem in which, since the material is formed by a hydrothermal synthesis method, it is difficult to control the compositions, desired characteristics cannot be obtained, and characteristics variation is significant.

The present invention has been made in view of the above problems, and an object of the present invention is to provide a piezoelectric component including a piezoelectric element enabling breakage of the piezoelectric element to be suppressed even in a case in which the piezoelectric element includes no substrate, and in which the piezoelectric element is thin (100 µm or less), a sensor including the piezoelectric component, and an actuator including the piezoelectric component.

A preferred embodiment of the piezoelectric component of the present invention has a piezoelectric element including a piezoelectric ceramic layer and a sintered metal layer on at least a first main surface of the piezoelectric ceramic layer, the sintered metal layer containing a non-precious metal; and a protective layer containing an elastic body covering first and second opposed main surfaces of the piezoelectric element. The piezoelectric ceramic layer contains 90 mol % or more of a perovskite compound that contains niobium, an alkali metal, and oxygen, and a thickness of the piezoelectric element is 100 µm or less.

Preferably, an end surface of the piezoelectric element is covered with the protective layer.

A thickness of the protective layer is preferably three times or more of a total thickness of the sintered metal layer and the piezoelectric ceramic layer.

Preferably, the thickness of the protective layer is 10 cm or less.

The elastic body preferably has Asker C hardness of 5 to 150. The elastic body preferably has a Young's modulus of 0.05 GPa to 8 GPa.

The elastic body preferably contains at least one material selected from polyethylene terephthalate, polybutylene terephthalate, polyethylene, vinyl chloride, polypropylene, polystyrene, acrylic resin, ABS resin, polyamide, polycarbonate, polylactic acid, Teflon®, silicone, and urethane.

The piezoelectric component may also include a reinforcing member on a main surface of the protective layer opposite to a surface thereof in contact with the piezoelectric element.

The reinforcing member preferably contains at least one selected from carbon fiber, glass fiber, cellulose fiber, and metal fiber.

The piezoelectric component may also include a conductive wire electrically connected to the piezoelectric element.

The piezoelectric component may also further include a conductive sheet interposed between the conductive wire and the piezoelectric element.

The conductive wire may be connected to the piezoelectric element by a conductive adhesive. The conductive adhesive may contain an epoxy-based or silicone-based resin containing a conductive filler. The conductive adhesive may alternatively contain solder and a thermosetting resin.

The piezoelectric component according to the present invention may be incorporated into a sensor or an actuator.

According to the present invention, it is possible to provide a piezoelectric component including a piezoelectric element enabling breakage of the piezoelectric element to be suppressed even in a case in which the piezoelectric element includes no substrate, and in which the piezoelectric element is thin (100 μm or less), a sensor including the piezoelectric component, and an actuator including the piezoelectric component.

DETAILED DESCRIPTION OF THE INVENTION

Figure 1:
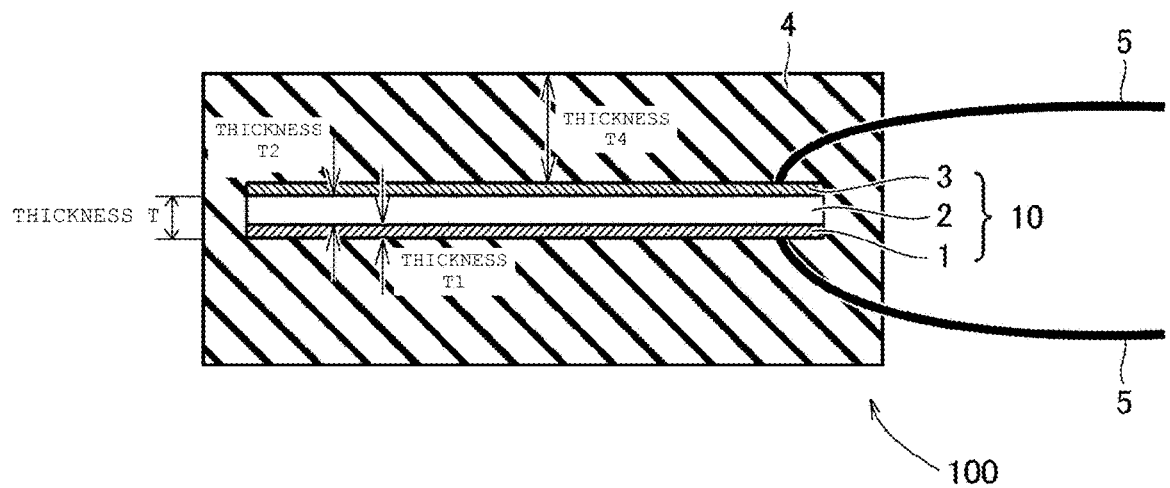
FIG. 1 is a schematic cross-sectional view of a piezoelectric component according to Embodiment 1.

Hereinbelow, embodiments of the present invention will be described with reference to the drawings. In the drawings, the same reference symbols represent the same or corresponding components.

In addition, dimensional relationships in terms of length, width, thickness, and depth are changed as appropriate for clarity and simplification of the drawings and do not represent actual dimensional relationships.

Embodiment 1

Referring to FIGS. 1 to 4, a piezoelectric component 100 according to the present invention includes a piezoelectric element 10 including a piezoelectric ceramic layer 2 and a sintered metal layer 1 provided on at least one main surface of the piezoelectric ceramic layer 2 and containing a non-precious metal. The piezoelectric element 10 may also include an external electrode layer 3 on an opposite surface of the piezoelectric ceramic layer 2 to the surface provided with the sintered metal layer 1.

Protective Layer

Both the main surfaces of the piezoelectric element 10 are entirely covered with a protective layer 4 containing an elastic body. Both the main surfaces of the piezoelectric element 10 are entirely (preferably uniformly) covered with the protective layer 4 in order for the piezoelectric ceramic layer 2 and the sintered metal layer 1 not to be exposed, to cause any stress applied to the piezoelectric element 10 to be distributed, and to prevent breakage of the piezoelectric element even in a case in which relatively high stress is applied.

Also, since the piezoelectric element 10 is covered with the protective layer 4 and thus buried in the piezoelectric component 100, strain inside the piezoelectric component can be measured. On the other hand, in a case in which the piezoelectric element is bonded to the surface of an elastic body or the like afterward, strain inside the piezoelectric component cannot be measured. Further, in a case in which the piezoelectric element is buried in the inside, it is possible to reduce processes and costs in manufacturing the piezoelectric component, and a piezoelectric sensor, an actuator, and the like using the piezoelectric component to a greater extent than in a case of bonding the piezoelectric element afterward.

The protective layer 4 can be formed by, for example, an injection molding method. Specifically, the piezoelectric element 10 can be covered with the protective layer 4 containing an elastic body by, in a state in which the piezoelectric element 10 is disposed at a predetermined position in an injection molding die, injecting an elastic raw material serving as a material for the protective layer into the die. Alternatively, the protective layer 4 can be formed by applying slurry containing the elastic raw material to both the main surfaces of the piezoelectric element 10 and solidifying the slurry.

Meanwhile, since a piezoelectric element containing an organic material has a low heat-resistant temperature, a protective layer cannot normally be formed by injection molding. However, the piezoelectric element used in the present invention has a high heat-resistant temperature, and the protective layer can be formed by injection molding. Also, while a conventional piezoelectric element using a lead-based piezoelectric ceramic requires a substrate, the piezoelectric element used in the present invention requires no substrate and thus has high responsiveness. The present invention is also significant in that such a highly responsive piezoelectric element can be housed inside a resin material or the like (protective layer 4) by injection molding or the like.

Not only both the main surfaces of the piezoelectric element 10 but also the end surfaces of the piezoelectric element 10 (the surfaces of the piezoelectric element 10 other than both the main surfaces) are preferably covered with the protective layer 4. Consequently, breakage of the end portions of the piezoelectric element 10 is suppressed, and an effect of suppression of breakage of the piezoelectric element according to the present invention is further enhanced. In addition, in a case in which both the entire main surfaces and the end surfaces of the piezoelectric element 10 are covered with the protective layer 4 containing an elastic body which does not transmit moisture, the piezoelectric element 10 is not exposed to moisture. Hence, durability (moisture resistance or the like) of the piezoelectric element 10 can be further improved.

In the present invention, a thickness T4 of the protective layer 4 is preferably three times or more a total thickness T of a thickness T1 of the sintered metal layer 1 and a thickness T2 of the piezoelectric ceramic layer 2.

Here, the thickness T does not include a thickness of an electrode which is not the sintered metal (such as the external electrode layer 3). Meanwhile, the thickness T4 of the protective layer 4 refers to a thickness in a direction perpendicular to the main surface of the piezoelectric ceramic layer 2, and a thickness (length) in a direction perpendicular to the end surface is not particularly limited. In a case in which the thickness T4 of the protective layer is within this range, the strength of the piezoelectric element 10 can further be increased. The thicknesses of the upper and lower protective layers in contact with the main surfaces of the piezoelectric element 10 may be equal or different as long as the thickness T4 of at least one of the upper and lower protective layers is within the above range. Meanwhile, in a case in which the thicknesses of the upper and lower protective layers are different (in a case in which the piezoelectric element is not located in the middle of the piezoelectric component), stress transmission is more likely to occur than in a case in which the thicknesses of the upper and lower protective layers are equal.

In the present invention, the thickness T4 of the protective layer 4 is preferably 50 µm to 10 cm. In a case in which the thickness T4 of the protective layer is larger than 10 cm, stress transmission occurs less, and a response signal is difficult to obtain. Also, in a case in which the thickness T4 of the protective layer is less than 50 µm, stress cannot sufficiently be distributed, and the effect of suppressing breakage of the piezoelectric element may be insufficient.

In the present invention, the elastic body refers to an object which deforms when a force weaker than a certain force is applied and which returns to its original shape when the force is removed. Examples of a constituent material for the elastic body are resin and rubber. The state of each of these constituent materials is, for example, solid or gel.

The elastic body preferably contains at least one (resin) selected from the group consisting of polyethylene terephthalate, polybutylene terephthalate, polyethylene, vinyl chloride, polypropylene, polystyrene, acrylic resin, ABS resin, polyamide, polycarbonate, polylactic acid, Teflon (registered trademark), silicone, and urethane.

The Asker C hardness of the elastic body is preferably 5 to 150, and more preferably 5 to 100. In a case in which the hardness of the elastic body is within this range, the strength of the piezoelectric element can further be increased, and breakage of the piezoelectric element can more reliably be suppressed. The Asker C hardness can be measured using an Asker rubber hardness meter C type (for example, one manufactured by Kobunshi Keiki Co., Ltd.). The Asker C hardness is an index (elastic modulus) which can appropriately represent the hardness (elastic property) of the elastic body in a case in which the elastic body is gel or rubber.

The elastic body preferably has a Young's modulus of 0.05 GPa to 8 GPa. In a case in which the Young's modulus of the elastic body is within this range, the strength of the piezoelectric element can further be increased, and breakage of the piezoelectric element can more reliably be suppressed. The Young's modulus is an index which can appropriately represent the elastic property of the elastic body in a case in which the elastic body is resin (curing resin) or the like.

Piezoelectric Element

In the piezoelectric element 10 used in the piezoelectric component 100 according to the present invention, the piezoelectric ceramic layer 2 contains a perovskite compound as a main substance. The main substance contains niobium, an alkali metal, and oxygen, and the content of the main substance with respect to the total molar amount of all the substances contained in the piezoelectric ceramic layer 2 is 90 mol % or more.

The thickness of the piezoelectric element 10 is 100 µm or less.

As the piezoelectric element 10, the piezoelectric element described in International Publication No. 2015/166914 can appropriately be used, for example. In a case in which the piezoelectric element includes a hard substrate, the piezoelectric element cannot significantly deflect. However, since the piezoelectric element according to the present invention requires no substrate, the piezoelectric element according to the present invention easily deflects under stress and functions as a sensor with high accuracy.

By reducing the thickness of the piezoelectric element 10 which includes no substrate, the electric charge to be generated can be increased when the same force is applied. Similarly, since the piezoelectric element is thin, the voltage to be applied can be lowered when the piezoelectric device is driven.

Figure 9:
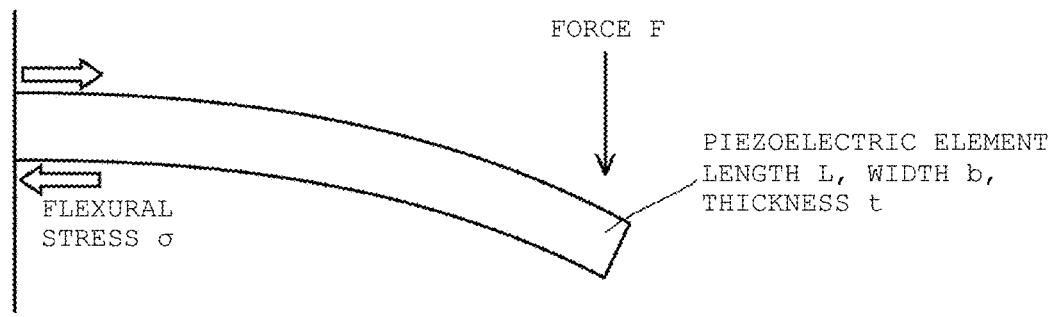
FIG. 9 is a schematic view for describing a relationship between the thickness of a piezoelectric element and electric charge to be generated.

Hereinbelow, the relationship between the thickness of the piezoelectric element and the electric charge will be described with reference to FIG. 9. In a case in which a force F is applied to the piezoelectric element (a length L, a width b, and a thickness t), flexural stress ρ is expressed by Equation (1) using a flexural moment M and a section modulus Z.

[Equation 1]

$$\sigma = \frac{M}{Z} = \frac{FL}{\frac{bt^2}{6}} \qquad \text{Equation (1)}$$

From a piezoelectric equation, an electric field E is expressed by Equation (2) using a piezoelectric constant d, the flexural stress σ, and a dielectric constant ε.

[Equation 2]

$$E = \frac{d}{\varepsilon}\sigma = \frac{6dFL}{\varepsilon bt^2} \qquad \text{Equation (2)}$$

Since the piezoelectric element is a capacitor, Equation (3) is established using electric charge Q, capacitance C, and voltage V.

[Equation 3]

$$Q = CV = \varepsilon \frac{Lb}{t} Et = \frac{6dFL^2}{t^2} \qquad \text{Equation (3)}$$

That is, as the thickness t of the piezoelectric element decreases, the electric charge to be generated increases at $1/t_2$, and the number of response signals increases. For this reason, the S/N ratio can be increased.

Referring to FIG. 1, the piezoelectric element 10 according to the present embodiment is in a flat-plate shape, for example.

The piezoelectric element 10 includes the sintered metal layer 1 containing a non-precious metal, the piezoelectric ceramic layer 2 provided integrally with the sintered metal layer 1 on the sintered metal layer 1, and the external electrode layer 3 provided on the piezoelectric ceramic layer 2. Here, the sintered metal layer 1 and the external electrode layer 3 are respectively provided on the lower surface and the upper surface of the piezoelectric ceramic layer 2 opposed to each other, and the sintered metal layer 1 and the external electrode layer 3 are opposed to each other with the piezoelectric ceramic layer 2 interposed therebetween.

The sintered metal layer 1 containing a non-precious metal has a structure in which a plurality of crystal grains of a non-precious metal are secured in contact with each other. Here, the non-precious metal is a metal other than gold (Au), silver (Ag), platinum (Pt), palladium (Pd), rhodium (Rh), iridium (Ir), ruthenium (Ru), and osmium (Os). The sintered metal refers to a metal which is in a metal powder state prior to sintering of the piezoelectric ceramic and which is co-sintered simultaneously with the piezoelectric ceramic to form a thin-plate-like metal. Meanwhile, an internal electrode is included in the sintered metal in a broad sense. However, in this context, a sintered metal on both main surfaces of which the piezoelectric ceramic layer 2 exists is defined as "an internal electrode", and a sintered metal only on one main surface of which the piezoelectric ceramic layer 2 exists is defined as "a sintered metal layer".

To form the sintered metal layer 1 at low cost, as a non-precious metal used for the sintered metal layer 1, a metal containing at least one kind selected from the group consisting of nickel (Ni), copper (Cu), and aluminum (Al) is preferably used, a metal containing at least either Ni or Cu is more preferably used, and a metal using Ni is further preferably used. In particular, in a case in which the piezoelectric element is thin (for example, 100 μm or less), using Ni as a non-precious metal is more advantageous than using Cu in that occurrence of migration can be suppressed.

The piezoelectric ceramic layer 2 contains a perovskite compound as a main substance, the main substance contains niobium (Nb), an alkali metal, and oxygen (O), and the content of the main substance with respect to the total molar amount of all the substances contained in the piezoelectric ceramic layer 2 is 90 mol % or more.

Meanwhile, the aforementioned perovskite compound as the main substance may contain tantalum (Ta).

In addition, as a subsidiary substance other than the main substance (perovskite compound) can be included in the perovskite compound. The subsidiary substance can be at least one kind selected from the group consisting of barium (Ba), strontium (Sr), calcium (Ca), zirconium (Zr), titanium (Ti), tin (Sn), manganese (Mn), Ni, scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), for example.

The piezoelectric ceramic layer 2 is provided integrally with the sintered metal layer 1. That is, at a bonding interface between the sintered metal layer 1 and the piezoelectric ceramic layer 2, crystal grains of the non-precious metal contained in the sintered metal layer 1 and crystal grains of the piezoelectric ceramic contained in the piezoelectric ceramic layer 2 are secured in contact with each other to cause the sintered metal layer 1 and the piezoelectric ceramic layer 2 to be bonded integrally.

The external electrode layer 3 is not particularly limited as long as the external electrode layer 3 is a member which contains a conductive material such as a non-precious metal and which can supply current from an outside into the piezoelectric ceramic layer 2 or take current out of the piezoelectric ceramic layer 2 to the outside. The external electrode layer 3 is formed after the piezoelectric ceramic layer 2 is sintered, for example, by sputtering, vapor deposition, or metal paste baking.

Figure 2:
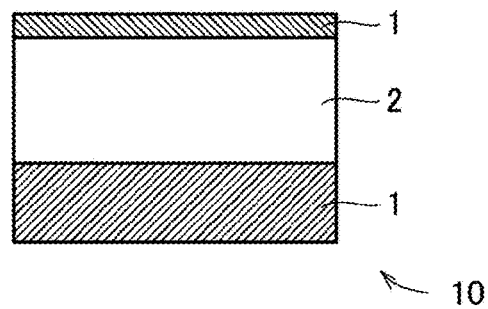
FIG. 2 is a schematic cross-sectional view of a modification example of the piezoelectric element according to Embodiment 1.

Also, the only electrode formed on the piezoelectric element 10 is preferably the sintered metal layer 1. A modification example of the piezoelectric element in which the external electrode layer 3 in Embodiment 1 is the sintered metal layer 1 is illustrated in FIG. 2. In this case, since the piezoelectric ceramic layer 2 and the external electrode layer 3 are integrally provided, at a bonding interface between the piezoelectric ceramic layer 2 and the external electrode layer 3, crystal grains of the piezoelectric ceramic contained in the piezoelectric ceramic layer 2 and crystal grains of a conductive material such as a non-precious metal contained in the external electrode layer 3 are secured in contact with each other. This causes the bonding between the piezoelectric ceramic layer 2 and the external electrode layer 3 to be stronger, and the occurrence of peeling of the external electrode layer 3 from the piezoelectric ceramic layer 2 can effectively be suppressed.

Method for Manufacturing Piezoelectric Element

Hereinbelow, an example of a method for manufacturing the piezoelectric element 10 according to Embodiment 1 will be described.

First, piezoelectric ceramic powder and non-precious metal powder are prepared.

The piezoelectric ceramic powder is a substance which becomes the piezoelectric ceramic layer 2 as a result of below-mentioned co-sintering. The piezoelectric ceramic powder can be obtained, for example, by weighing at least Nb oxide powder and alkali metal carbonate powder in order for the content of the perovskite compound serving as the main substance to be 90 mol % or more, then mixing these to prepare piezoelectric ceramic raw material powder, and calcining and then pulverizing the powder. The piezoelectric ceramic powder may be or may not be combined with another substance and may be in a form other than a powder form, such as a sheet form, a tape form, and a paste form.

The non-precious metal powder is a substance which becomes the sintered metal layer 1 containing a non-precious metal as a result of below-mentioned co-sintering. Similarly, the non-precious metal powder may be or may not be combined with another substance and may be in a form other than a powder form, such as a sheet form, a tape form, and a paste form. In a case in which the non-precious metal powder is in a sheet form or a tape form, the non-precious metal powder is uniform. In a case in which the piezoelectric element 10 is thin, the non-precious metal powder is uniformly sintered, and the piezoelectric element 10 is thus less likely to break. For this reason, the form of the non-precious metal powder is more preferably a sheet form or a tape form.

Subsequently, the non-precious metal powder and the piezoelectric ceramic powder are laminated. A way to laminate the non-precious metal powder and the piezoelectric ceramic powder is not particularly limited. For example, a way can be used in which, after the non-precious metal powder in a sheet or tape form is provided on the surface of a substrate such as a polyethylene terephthalate (PET) film, the piezoelectric ceramic powder in a sheet, tape or paste form is provided on the non-precious metal powder. Meanwhile, the PET film is peeled before co-sintering.

Subsequently, co-sintering is performed in a state in which the non-precious metal powder and the piezoelectric ceramic powder are laminated to cause the sintered metal layer 1 and the piezoelectric ceramic layer 2 to be integrated. At a bonding interface between the sintered metal layer 1 and the piezoelectric ceramic layer 2, crystal grains of the non-precious metal contained in the sintered metal layer 1 and crystal grains of the piezoelectric ceramic contained in the piezoelectric ceramic layer 2 are secured in contact with each other to cause the sintered metal layer 1 and the piezoelectric ceramic layer 2 to be integrated. Hence, high bonding strength is developed between the sintered metal layer 1 and the piezoelectric ceramic layer 2.

Meanwhile, in a case of forming the piezoelectric element 10 including the piezoelectric ceramic layer 2 and the sintered metal layer 1, or in a case of forming the piezoelectric element 10 including the piezoelectric ceramic layer 2 including the internal electrode and the sintered metal layer 1, the piezoelectric element is preferably interposed between two ceramics containing at least one substance selected from the group consisting of $ZrO_2$, $Al_2O_3$ and $SiO_2$ as a main component and co-sintered. The ceramic may be dense or may have pores. The ceramic may be plate-shaped, massive, or have a curved surface. In this manner, unintended deformation at the time of co-sintering can be suppressed.

Here, the co-sintering of the non-precious metal powder and the piezoelectric ceramic powder is preferably performed under an atmosphere under which the oxygen partial pressure is 1000 times or less the oxygen partial pressure at which the non-precious metal contained in the non-precious metal powder (the non-precious metal contained in the sintered metal layer 1) and the non-precious metal oxide are in equilibrium. When the oxygen partial pressure in the atmosphere is higher than the equilibrium oxygen partial pressure between the non-precious metal and the non-precious metal oxide, oxidation of the non-precious metal tends to proceed. However, the oxidation of the non-precious metal does not proceed rapidly. Hence, even in a case in which the upper limit of the oxygen partial pressure in the co-sintering atmosphere is set to 1000 times the equilibrium oxygen partial pressure between the non-precious metal and the non-precious metal oxide, sintering of the non-precious metal powder can proceed while suppressing oxidation of the non-precious metal, and the sintered metal layer 1 can be formed while suppressing inclusion of non-precious metal oxide such as NiO and copper oxide ($Cu_2O$).

Thereafter, by forming the external electrode layer 3 on the opposite surface of the piezoelectric ceramic layer 2 to the surface provided with the sintered metal layer 1, the piezoelectric element 10 according to Embodiment 1 can be manufactured.

A material for forming the external electrode layer 3 may be anything as long as the material is conductive, and examples thereof are silver, gold, platinum, nickel, and copper. A method for forming the external electrode layer 3 is not particularly limited, and examples thereof include a sputtering method, a vapor deposition method, and a method of baking metal powder or metal powder paste.

In Embodiment 1, the sintered metal layer 1 and the piezoelectric ceramic layer 2 can be formed by co-sintering the non-precious metal powder and the piezoelectric ceramic powder. Therefore, without using a substrate, each of the sintered metal layer 1 and the piezoelectric ceramic layer 2 can be thinner than in a conventional case, and the thickness of the piezoelectric element can be 100 μm or less. Also, during cooling after co-sintering, the piezoelectric ceramic layer 2 is subject to compressive stress from the sintered metal layer 1. However, since the sintered metal layer 1 and the piezoelectric ceramic layer 2 are integrally formed, and the bonding strength is high, peeling of the piezoelectric ceramic layer 2 due to the compressive stress can be suppressed.

In the piezoelectric element disclosed in Japanese Patent Laid-Open No. 2000-337971, a piezoelectric ceramic such as a lead zirconate titanate (PZT) thin film is formed on the surface of a titanium thin film electrode on a resin film substrate by hydrothermal synthesis. Hence, there is an upper limit in a temperature during the hydrothermal synthesis to prevent the resin film from being softened, and the piezoelectric material is limited to a substance which is crystallized at a low temperature. In addition, since the hydrothermal synthesis has low composition controllability, it is considered difficult to obtain a crystal film having desired characteristics. On the other hand, in the present invention, since the piezoelectric element can be manufactured without using a substrate, the method according to the present invention is advantageous in that the method is not limited by the material of the substrate or the like. Also, in the present invention, the piezoelectric element can be manufactured by using a solid phase method. In this case, the composition controllability is high, and a crystal film (piezoelectric element) having desired characteristics is easily obtained.

Embodiment 2

Figure 3:
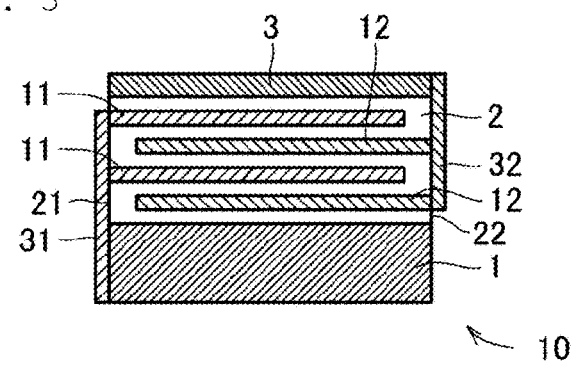
FIG. 3 is a schematic cross-sectional view of a piezoelectric element according to Embodiment 2.
Figure 4:
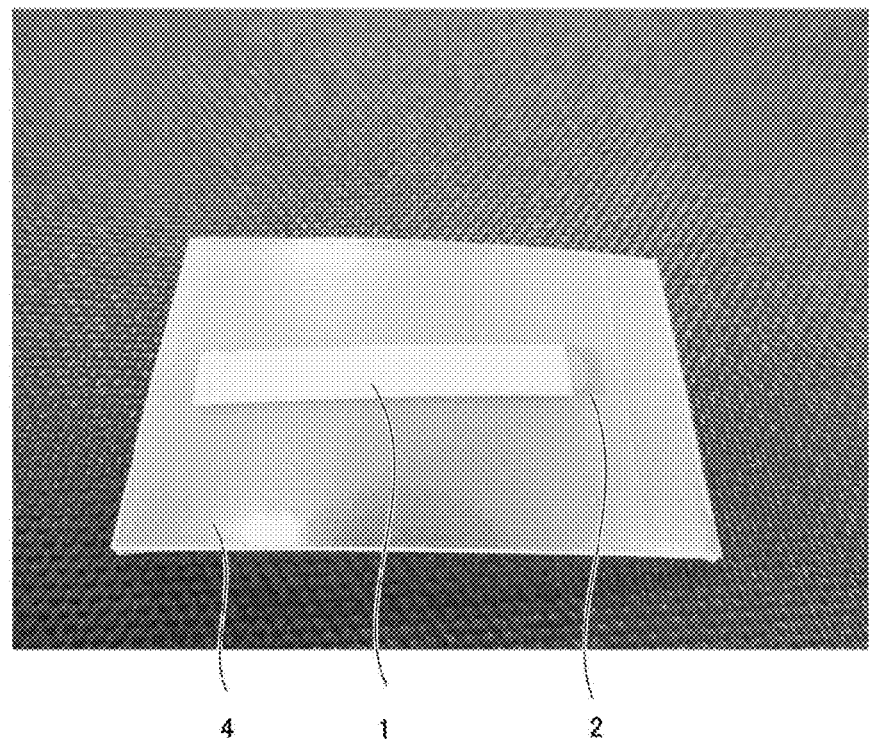
FIG. 4 is a photograph of the entire piezoelectric component according to Embodiment 1.

A piezoelectric component according to the present embodiment differs from that according to Embodiment 1 in that the piezoelectric element 10 in the piezoelectric component 100 illustrated in FIG. 1 is changed to a piezoelectric element 10 illustrated in FIG. 3. The present embodiment is similar to Embodiment 1 in the other respects.

The piezoelectric element 10 used in Embodiment 2 includes a piezoelectric ceramic layer 2 formed integrally with a sintered metal layer 1 and formed, for example, in a substantially rectangular parallelepiped shape. The piezoelectric ceramic layer 2 includes therein two first internal electrodes 11 and two second internal electrodes 12 and includes a first connection electrode 31 and a second connection electrode 32 on a first side surface 21 and a second side surface 22 of the piezoelectric ceramic layer 2 opposed to each other, respectively. Meanwhile, although each number of the first internal electrodes 11 and the second internal electrodes 12 is two in Embodiment 2, each number of the first internal electrodes 11 and the second internal electrodes 12 is not particularly limited. The number may be one or three or more. Also, the number of the first internal electrodes 11 and the number of the second internal electrodes 12 are not necessarily the same and may be different.

In the present embodiment, a total thickness T of a thickness T1 of the sintered metal layer 1 and a thickness T2 of the piezoelectric ceramic layer 2 includes a thickness of an internal electrode serving as a sintered metal.

Also, an external electrode layer 3 is preferably provided integrally with the piezoelectric ceramic layer 2. That is, the only electrodes formed on the piezoelectric element 10 may be the sintered metal and the internal electrode.

Embodiment 3

Figure 5:
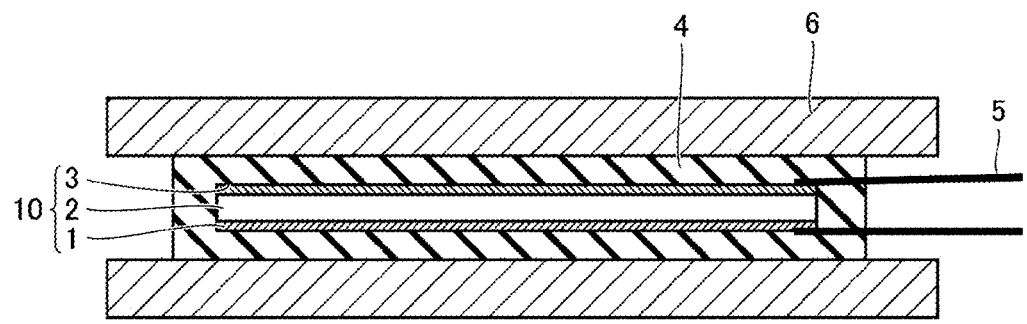
FIG. 5 is a schematic cross-sectional view illustrating an example of a piezoelectric component according to Embodiment 3.

As illustrated in FIG. 5, the piezoelectric component 100 described above in Embodiments 1 and 2 may further include a reinforcing member 6 on an opposite main surface of the protective layer 4 to a surface in contact with the piezoelectric element 10. The reinforcing member 6 may cover, for example, the opposite main surface of the protective layer 4 to the surface in contact with the piezoelectric element 10, that is, the entire main surface not in contact with the piezoelectric element 10, and may further cover the end surface of the protective layer 4 or the piezoelectric element 10. The reinforcing member 6 may cover one surface out of the opposite main surfaces of the protective layer 4 to the surfaces in contact with the piezoelectric element 10 or may cover both the upper and lower surfaces. The entire main surface of the protective layer 4 is preferably uniformly covered with the reinforcing member 6. In a case in which the reinforcing members 6 are provided on both the upper and lower surfaces of the protective layer 4, the thicknesses of the upper and lower reinforcing members 6 may be the same or different. By providing the reinforcing member 6 in the piezoelectric component 100, it is possible to prevent the piezoelectric component 100 from being flexed to reach a stroke causing breakage.

The thickness of the reinforcing member 6 is preferably 10 μm to 5 mm, and more preferably 50 μm to 3 mm. In a case in which the thickness of the reinforcing member 6 is too short, sufficient reinforcing properties cannot be obtained, and breakage of the piezoelectric element 10 may not sufficiently be suppressed. In a case in which the thickness of the reinforcing member 6 is too long, stress transmission may occur less, and a response signal may be difficult to obtain.

For the reinforcing member 6, it is preferable to use a harder material than the elastic body contained in the protective layer 4, that is, a material having high flexural strength in a testing method of flexural properties represented by JIS K 7074 (1988). For example, it is more preferable to use a material having flexural strength of 100 MPa or higher. The reinforcing member 6 preferably contains at least one selected from the group consisting of carbon fiber, glass fiber, cellulose fiber, and metal fiber, and as the reinforcing member 6, a member obtained by forming a resin containing these materials in a sheet shape can be used.

Embodiment 4

Figure 6:
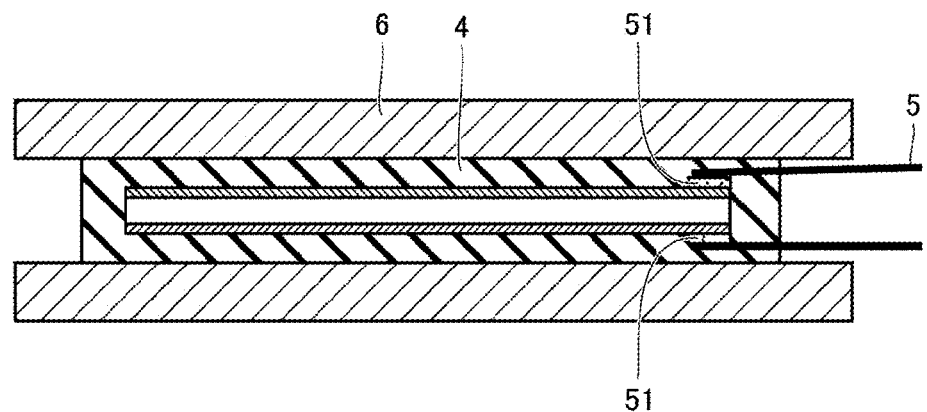
FIG. 6 is a schematic cross-sectional view illustrating an example of a piezoelectric component according to Embodiment 4.

The piezoelectric component 100 according to each of Embodiments 1 to 3 may further include a conductive wire 5 electrically connected to the piezoelectric element 10, and the conductive wire 5 may directly or indirectly be connected to the piezoelectric element 10. The conductive wire 5 is connected to, for example, the sintered metal layer 1 or the external electrode layer 3 of the piezoelectric element 10. As illustrated in FIG. 6, the conductive wire 5 may be connected to the piezoelectric element 10 by a conductive adhesive 51. By connecting the conductive wire 5 with the conductive adhesive 51 interposed between the conductive wire 5 and the piezoelectric element 10, voltage generated from the piezoelectric element 10 can be measured.

The conductive adhesive 51 is not particularly limited as long as it is an adhesive having conductivity, and an example thereof includes a resin containing a conductive filler. As the conductive filler, for example, a metal filler, a metal-coated resin filler, a carbon filler, and a mixture thereof can be used. Examples of the metal filler include gold powder, silver powder, copper powder, nickel powder, and aluminum powder. These conductive fillers can be used alone or in combination of two or more. The grain size and shape can appropriately be set. Examples of a binder resin used for the conductive adhesive 51 include epoxy-based, urethane-based, silicone-based, acrylic-based, polyamide-based, and other thermosetting resins and thermoplastic resins. From a viewpoint of conductivity, it is preferable to use silver powder as the conductive filler, and epoxy-based resin or silicone-based resin as the binder resin. Further, the conductive adhesive 51 may contain solder, may contain solder and a thermosetting resin, and may include a flux component.

Embodiment 5

Figure 7:
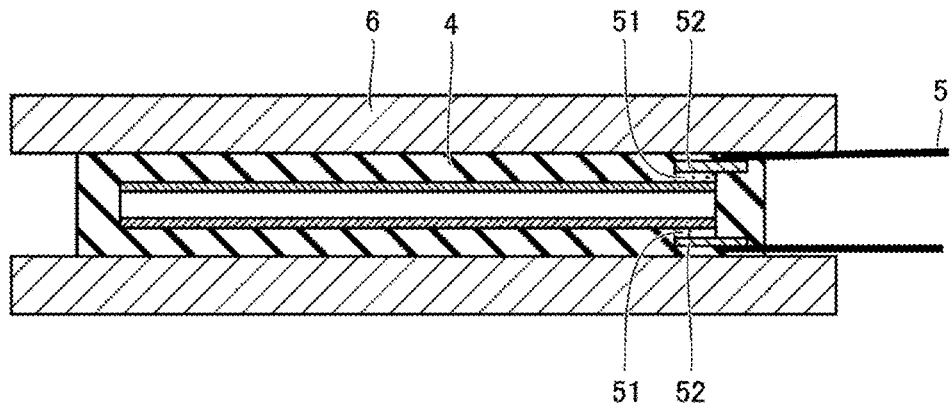
FIG. 7 is a schematic cross-sectional view illustrating an example of a piezoelectric component according to Embodiment 5.

The piezoelectric component 100 according to each of Embodiments 1 to 4 may further include a conductive sheet 52, and the conductive wire 5 may be connected to the piezoelectric element 10 with the conductive sheet 52 interposed therebetween. As illustrated in FIG. 7, the conductive sheet 52 may be connected to the piezoelectric element 10 by the conductive adhesive 51. Although the conductive sheet 52 is not particularly limited, the conductive sheet 52 can be formed using a metal as a main component, for example. Examples of the metal used for the conductive sheet 52 include silver, copper, gold, nickel, and aluminum. The conductive sheet 52 may be a metal plate or a metal foil containing the above metal as a main component, for example. In a case in which the conductive sheet 52 is a metal plate, the thickness thereof can be set to 50 μm to 500 μm, for example. In a case in which the conductive sheet 52 is a metal foil, the metal foil can be formed by applying a coating liquid containing the above metal to the sintered metal layer 1 or the external electrode layer 3 and drying the coating liquid, and the thickness thereof can be set to 5 μm to 50 μm, for example. In a case in which the piezoelectric element 10 and the conductive wire 5 are indirectly connected to each other with the conductive sheet 52 interposed therebetween, the piezoelectric element 10 and the conductive wire 5 are preferably connected at positions at which the piezoelectric element 10 and the conductive wire 5 do not overlap as seen (projected) in a direction perpendicular to the main surface of the piezoelectric component 100 as illustrated in FIG. 7. In this case, stress applied to the piezoelectric element 10 is reduced, and breakage of the piezoelectric element 10 can more easily be suppressed.

EXAMPLES

Production of Piezoelectric Element

First, potassium carbonate ($K_2CO_3$), sodium carbonate ($Na_2CO_3$), lithium carbonate ($Li_2CO_3$), niobium oxide ($Nb_2O_5$), calcium carbonate ($CaCO_3$), zirconium oxide ($ZrO_2$), manganese carbonate ($MnCO_3$), and ytterbium oxide ($Yb_2O_3$) were prepared in powdered states.

Subsequently, $K_2CO_3$, $Na_2CO_3$, $Li_2CO_3$, $Nb_2O_5$, $CaCO_3$, and $ZrO_2$ in powdered states were weighed in order that the ratio of an alkali metal niobate compound to calcium zirconate forming a solid solution might be 98:2, and that the molar ratio of alkali metals (K, Na, and Li) might be K:Na:Li=0.45:0.53:0.02. Also, $ZrO_2$, $MnCO_3$, and $Yb_2O_3$ in powdered states were weighed in order that $ZrO_2$ was 3 mol, MnO was 5 mol, and $Yb_2O_3$ was 0.25 mol with respect to 100 mol of the above solid solution.

Subsequently, the powder weighed as described above was put into a pot mill containing PSZ balls and was mixed by a wet process by rotating the pot mill for about 90 hours using ethanol as a solvent to obtain piezoelectric ceramic raw material powder. The obtained piezoelectric ceramic raw material powder was then dried, calcined at a temperature of 900° C., and pulverized to obtain piezoelectric ceramic powder represented by a composition formula of [100 {0.98 ($K_{0.45}N_{0.53}Li_{0.02}$) $NbO_3$–0.02$CaZrO_3$}+3$ZrO_2$+5MnO+0.25$Yb_2O_3$].

Subsequently, the piezoelectric ceramic powder obtained as described above was put into a pot mill together with an organic binder, a dispersant, acetone, a plasticizer, and PSZ balls, was sufficiently mixed in a wet process while rotating the pot mill, and was formed in a sheet shape by means of a doctor blade method to obtain a piezoelectric ceramic sheet.

Also, similarly to the sheet forming using the piezoelectric ceramic powder, Ni powder, an organic binder and the like were put into a pot mill and sufficiently mixed while rotating the pot mill and were formed in a sheet shape by means of a doctor blade method to obtain a non-precious metal powder sheet.

Subsequently, the non-precious metal powder sheet, which was to be the sintered metal layer 1, was bonded on a PET film. The piezoelectric ceramic sheet was laminated on the non-precious metal powder sheet, and the non-precious metal powder sheet was further laminated. After peeling the PET film, the laminated body was subject to hydrostatic pressurization and was co-sintered for two hours at a temperature of 1000° C. to 1160° C. under a controlled atmosphere in order that the oxygen partial pressure may be biased further to a reduction side by 0.5 digits than the Ni—NiO equilibrium oxygen partial pressure (the oxygen partial pressure of 1/3.16 the Ni—NiO equilibrium oxygen partial pressure) to obtain a test piezoelectric element in which the piezoelectric ceramic layer 2 and the sintered metal layers 1 on both the sides of the piezoelectric ceramic layer 2 were integrally formed. In the obtained piezoelectric element 10, the thickness T1 of each (one) of the two sintered metal layers 1 is 1 μm, the thickness T2 of the piezoelectric ceramic layer 2 is 30 μm, the width of the piezoelectric element is 5 mm, and the length of the piezoelectric element is 10 mm. By connecting the piezoelectric element 10 to the conductive wire 5, voltage generated from the piezoelectric element can be measured.

Example 1

Unsolidified urethane resins (elastic bodies) having Asker C hardness of 5, 50, 100, and 150 were prepared, and each resin was applied to both the entire main surfaces of the above-described test piezoelectric element and was sufficiently solidified. As a result, the protective layers were formed on both the entire main surfaces of the piezoelectric element.

The thicknesses of the two protective layers formed on both the main surfaces of the piezoelectric element were the same, and the thickness T4 of the protective layer formed on each main surface of the piezoelectric element was 1 mm.

Figure 8:
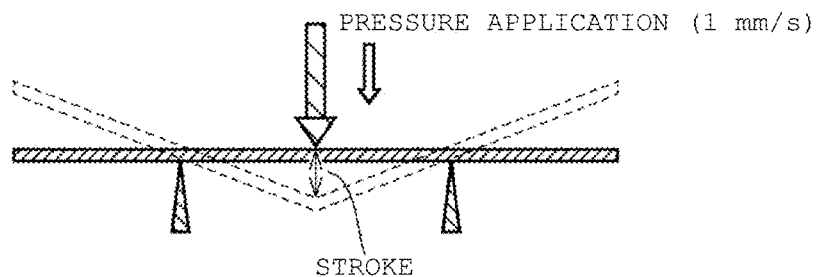
FIG. 8 is a schematic view for describing a three-point test of flexural properties in Examples.

Each piezoelectric component was subject to a three-point test of flexural properties using a micro-autograph MST-I manufactured by SHIMAZU with a distance between fulcrums of 5 mm and indenting speed of 1 mm/s (FIG. 8). Table 1 shows strokes when the piezoelectric component (piezoelectric element) breaks (a moving distance of an indenting jig during the period from contact of the indenting jig with the piezoelectric component (piezoelectric element) to breakage of the piezoelectric component (piezoelectric element)).

TABLE 1

| Protective layer | | |
| --- | --- | --- |
| Asker C hardness | Material | Stroke |
| No protective layer (comparative example) | — | 0.3 mm |

TABLE 1-continued

| Protective layer | | |
| --- | --- | --- |
| Asker C hardness | Material | Stroke |
| 5 | Urethane | 0.6 mm |
| 50 | Urethane | 0.8 mm |
| 100 | Urethane | 0.5 mm |
| 150 | Urethane | 0.4 mm |

As shown in Table 1, in a case in which the piezoelectric element is covered with the protective layer containing the urethane resin having Asker C hardness of 5 or more and 150 or less, the stroke at the time of breakage is longer than in a case without the protective layer, and the breakage resistance of the piezoelectric element is improved.

Example 2

Unsolidified materials obtained by heating and softening synthetic rubber with a Young's modulus of 0.05 GPa or 0.1 GPa, polycarbonate with a Young's modulus of 2 GPa, and polybutylene terephthalate with a Young's modulus of 8 GPa were prepared, and each material was applied to both the entire main surfaces of the above-described test piezoelectric element to have the thickness T4 of the protective layer (the thickness of the protective layer on one side) of 1 mm and was sufficiently solidified.

Each piezoelectric component was subject to a three-point test of flexural properties using a micro-autograph MST-I manufactured by SHIMAZU with a distance between fulcrums of 5 mm and indenting speed of 1 mm/s. At the same time as the three-point test of flexural properties, the conductive wire and an oscilloscope were connected to measure a signal generated as a result of deflection of the piezoelectric element. Table 2 shows strokes when the piezoelectric component (piezoelectric element) breaks.

TABLE 2

| Protective layer | | |
| --- | --- | --- |
| Young's modulus (GPa) | Material | Stroke |
| No protective layer (comparative example) | — | 0.3 mm |
| 0.05 | Synthetic rubber | 0.5 mm |
| 0.1 | Synthetic rubber | 0.8 mm |
| 2 | Polycarbonate | 1.2 mm |
| 8 | Polybutylene terephthalate | 1.5 mm |

As shown in Table 2, in a case in which the piezoelectric element is covered with the protective layer containing the elastic body having a Young's modulus of 0.05 GPa or more and 8 GPa or less, the stroke at the time of breakage is longer than in a case without the protective layer, and the breakage resistance of the piezoelectric element is improved. Also, the voltage generated as a result of deflection of the piezoelectric element was able to be measured.

Example 3

An unsolidified urethane resin having Asker C hardness of 10 was prepared, was applied to both the entire main surfaces of the above-described test piezoelectric element to have the thickness T4 of the protective layer of 52 μm, 96 μm, 203 μm, 1010 μm, 1 cm, 10 cm, and 20 cm, and was sufficiently solidified.

Each piezoelectric component was subject to a three-point test of flexural properties in which a jig was pushed until the stroke reached 0.5 mm. At the same time, the conductive wire extended from the piezoelectric element was connected to an oscilloscope, and an electric response (response current) was checked during the three-point test of flexural properties. The result is shown in Table 3.

TABLE 3

| Protective layer | | | Electric response |
|---|---|---|---|
| One side thickness T4 | Material | Breakage | |
| 52 μm | Urethane | Yes | — |
| 96 μm | Urethane | No | Yes |
| 203 μm | Urethane | No | Yes |
| 1010 μm | Urethane | No | Yes |
| 1 cm | Urethane | No | Yes |
| 10 cm | Urethane | No | Yes |
| 20 cm | Urethane | No | Weak |

As shown in Table 3, in a case in which the thickness T4 of the protective layer was 52 μm, the piezoelectric component broke when the stroke was 0.5 mm. Also, in a case in which the thickness T4 of the protective layer was 20 cm, the electric response was attenuated. When the thickness T4 of the protective layer was 96 μm to 10 cm, the piezoelectric component did not break and showed a favorable electric response.

Meanwhile, in addition to the three-point test of flexural properties, AC voltage of 0 to 30V was applied, and the displacement of each of the piezoelectric components was measured with use of a laser Doppler vibrometer LV1610 manufactured by ONOSOKKI. It was found that the displacement as well as the voltage was measured in each of these piezoelectric components, and that each of these piezoelectric components functions as an actuator as well. Accordingly, it was found that the breakage resistance of the piezoelectric element was improved in a case in which the thickness T4 of the protective layer 4 was three times or more the total thickness T of the thickness T1 of the sintered metal layer 1 and the thickness T2 of the piezoelectric ceramic layer 2 in a case in which the thickness T1 of the sintered metal layer 1 was 2 μm, and in which the thickness T2 of the piezoelectric ceramic layer 2 was 30 μm. Also, in a case in which the thickness T4 of the protective layer 4 is 10 cm or less, the strength of the piezoelectric element can be increased without losing the electric response properties.

Comparative Test

Figure 10:
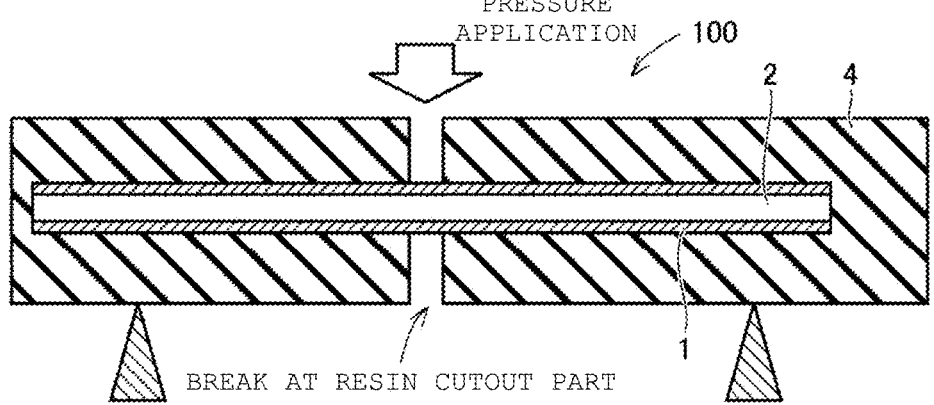
FIG. 10 is a schematic cross-sectional view illustrating a three-point test of flexural properties of a piezoelectric component in a comparative test.

A piezoelectric component 100 was produced in a similar manner to that of the piezoelectric component having the thickness T4 of the protective layer of 203 μm in Example 3, in which a part of the resin was not applied, in which a slit-like cutout part was formed in the protective layer, and in which the sintered metal layer 1 was exposed at the part. When a three-point test of flexural properties was performed in a similar manner to that in Example 1, the piezoelectric component broke at the same stroke (0.3 mm) as that in the case of the piezoelectric element single body (FIG. 10). It is considered that, in a case in which the main surface of the piezoelectric element is not entirely covered but is partially exposed, stress is concentrated on the exposed part to cause the element to easily break at the part.

It is to be understood that the embodiments disclosed here are illustrative only and are not limitative in all respects. The scope of the present invention is defined not by the above description but by the claims, and the present invention is intended to include any modifications within the meaning and scope equivalent to those of the claims.

DESCRIPTION OF REFERENCE SYMBOLS

1: Sintered metal layer
2: Piezoelectric ceramic layer
3: External electrode layer
10: Piezoelectric element
4: Protective layer
5: Conductive wire
51: Conductive adhesive
52: Conductive sheet
6: Reinforcing member
11: First internal electrode
12: Second internal electrode
21: First side surface
22: Second side surface
31: First connection electrode
32: Second connection electrode
100: Piezoelectric component

The invention claimed is:

1. A piezoelectric component comprising:
a piezoelectric element including a piezoelectric ceramic layer and a sintered metal layer on at least a first main surface of the piezoelectric ceramic layer, the sintered metal layer containing a non-precious metal; and
a protective layer containing an elastic body covering first and second opposed main surfaces of the piezoelectric element,
wherein the piezoelectric ceramic layer contains 90 mol % or more of a perovskite compound that contains niobium, an alkali metal, and oxygen, and
wherein a thickness of the piezoelectric element is 100 μm or less.

2. The piezoelectric component according to claim 1, wherein the elastic body contains at least one material selected from polyethylene terephthalate, polybutylene terephthalate, polyethylene, vinyl chloride, polypropylene, polystyrene, acrylic resin, ABS resin, polyamide, polycarbonate, polylactic acid, Teflon®, silicone, and urethane.

3. The piezoelectric component according to claim 1, wherein the non-precious metal is a metal containing at least one of nickel, copper, and aluminum.

4. The piezoelectric component according to claim 1, wherein the protective layer covers an end surface of the piezoelectric element.

5. The piezoelectric component according to claim 1, wherein the elastic body has a Young's modulus of 0.05 GPa to 8 GPa.

6. The piezoelectric component according to claim 1, wherein the thickness of the protective layer is 10 cm or less.

7. The piezoelectric component according to claim 1, wherein the elastic body has an Asker C hardness of 5 to 150.

8. An actuator comprising the piezoelectric component according to claim 1.

9. A sensor comprising the piezoelectric component according to claim 1.

10. The piezoelectric component according to claim 1, further comprising a reinforcing member on a surface of the protective layer opposite to a surface of the protective layer in contact with the piezoelectric element.

11. The piezoelectric component according to claim 10, wherein the reinforcing member contains at least one material selected from carbon fiber, glass fiber, cellulose fiber, and metal fiber.

12. The piezoelectric component according to claim 1, wherein a thickness of the protective layer is three times or more a total thickness of the sintered metal layer and the piezoelectric ceramic layer.

13. The piezoelectric component according to claim 12, wherein the thickness of the protective layer is 10 cm or less.

14. The piezoelectric component according to claim 1, further comprising a conductive wire electrically connected to the piezoelectric element.

15. The piezoelectric component according to claim 14, wherein the conductive wire is connected to the piezoelectric element by a conductive adhesive, and
wherein the conductive adhesive contains an epoxy-based or silicone-based resin containing a conductive filler.

16. The piezoelectric component according to claim 14, wherein the conductive wire is connected to the piezoelectric element by a conductive adhesive, and
wherein the conductive adhesive contains solder and a thermosetting resin.

17. The piezoelectric component according to claim 14, further comprising a conductive sheet interposed between the conductive wire and the piezoelectric element.

18. The piezoelectric component according to claim 17, wherein the conductive sheet is connected to the piezoelectric element by a conductive adhesive, and
wherein the conductive adhesive contains an epoxy-based or silicone-based resin containing a conductive filler.

19. The piezoelectric component according to claim 17, wherein the conductive wire is connected to the piezoelectric element at a position where the piezoelectric element and the conductive wire do not overlap each other in a direction perpendicular to a main surface of the piezoelectric component.

20. The piezoelectric component according to claim 17, wherein the conductive sheet is connected to the piezoelectric element by a conductive adhesive, and
wherein the conductive adhesive contains solder and a thermosetting resin.

* * * * *